(12) United States Patent
Sutardja et al.

(10) Patent No.: US 7,836,364 B1
(45) Date of Patent: Nov. 16, 2010

(54) CIRCUITS, ARCHITECTURES, APPARATUSES, SYSTEMS, METHODS, ALGORITHMS, SOFTWARE AND FIRMWARE FOR USING RESERVED CELLS TO INDICATE DEFECT POSITIONS

(75) Inventors: Pantas Sutardja, Los Gatos, CA (US); Zining Wu, Los Altos, CA (US)

(73) Assignee: Marvell International Ltd., Hamilton (BM)

( * ) Notice: Subject to any disclaimer, the term of this patent is extended or adjusted under 35 U.S.C. 154(b) by 785 days.

(21) Appl. No.: 11/789,867

(22) Filed: Apr. 25, 2007

Related U.S. Application Data

(60) Provisional application No. 60/809,208, filed on May 30, 2006.

(51) Int. Cl.
*G11C 29/00* (2006.01)
*G11C 7/00* (2006.01)
*H03M 13/00* (2006.01)

(52) U.S. Cl. .................. 714/723; 714/718; 714/758; 714/766; 365/200; 365/201

(58) Field of Classification Search ............ 714/723, 714/718, 758, 766; 365/200, 201
See application file for complete search history.

(56) References Cited

U.S. PATENT DOCUMENTS

| | | | | |
|---|---|---|---|---|
| 4,380,066 A * | 4/1983 | Spencer et al. | ................ | 714/6 |
| 5,199,033 A * | 3/1993 | McGeoch et al. | ............. | 714/7 |
| 5,796,653 A * | 8/1998 | Gaultier | ................ | 365/185.09 |
| 5,974,564 A * | 10/1999 | Jeddeloh | ................ | 714/8 |
| 6,034,891 A * | 3/2000 | Norman | ................ | 365/185.09 |
| 6,094,368 A * | 7/2000 | Ching | ................ | 365/49.15 |
| 6,564,346 B1 * | 5/2003 | Vollrath et al. | ............ | 714/723 |
| 6,651,202 B1 * | 11/2003 | Phan | ................ | 714/733 |
| 6,700,815 B2 * | 3/2004 | Le et al. | ................ | 365/185.03 |
| 6,799,256 B2 * | 9/2004 | Van Buskirk et al. | ....... | 711/156 |
| 7,180,795 B1 * | 2/2007 | Chan et al. | ............ | 365/189.09 |
| 7,280,415 B2 * | 10/2007 | Hwang et al. | .......... | 365/189.09 |
| 7,606,102 B2 * | 10/2009 | Blodgett | ................ | 365/225.7 |
| 2002/0012280 A1 * | 1/2002 | Yamamoto et al. | .......... | 365/200 |
| 2002/0085436 A1 * | 7/2002 | Chang | ................ | 365/200 |
| 2003/0086314 A1 * | 5/2003 | Okazawa et al. | ............ | 365/200 |
| 2004/0037112 A1 * | 2/2004 | Ooishi | ................ | 365/185.09 |

* cited by examiner

*Primary Examiner*—John J Tabone, Jr.

(57) ABSTRACT

Circuits, architectures, systems, methods, algorithms, software and firmware for indicating positions of defective data storage cells using reserved (e.g., "pilot") cells. The circuit generally includes a memory having multiple subunits, each subunit containing multiple data storage cells and at least one reserved cell. The reserved cells store information identifying whether one or more data storage cells in a subunit are defective. The method of identifying defective memory positions generally includes determining the status of data storage cells in a multi-subunit memory; storing such status information in a reserved cell; and reading the reserved cell. In various embodiments, the reserved cells differentiate between fewer voltage levels and/or store a lower density of information than the data storage cells. The present invention improves error correction capabilities using cells that are typically already available in many conventional nonvolatile memories. In some cases, marking data from defective cells as erasures effectively doubles the error correction capability of the system. When the reserved cells contain more than one level, the overhead for a given level of fault coverage decreases as a function of memory size.

33 Claims, 13 Drawing Sheets

FIG. 1
(Related Art)
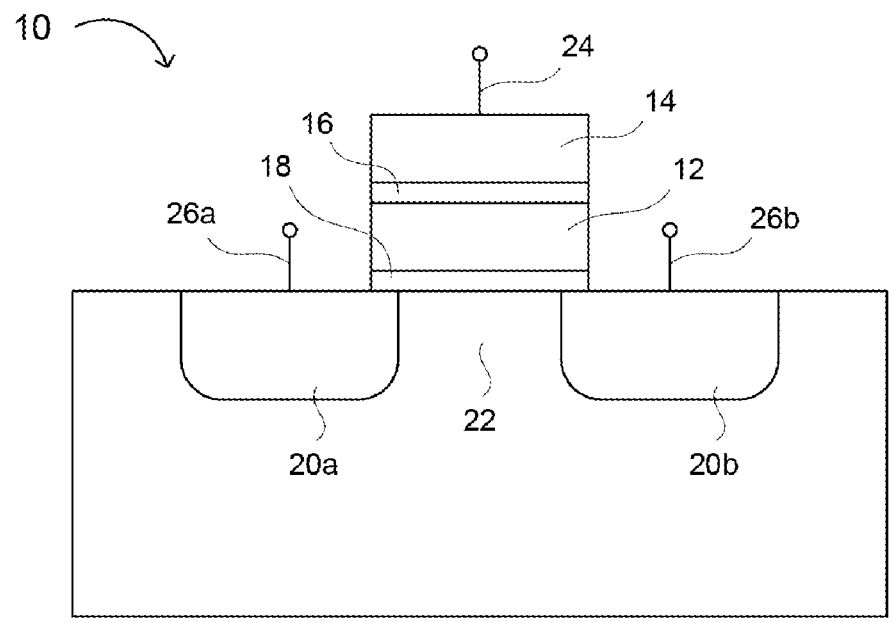
FIG. 2A
(Related Art)
FIG. 2B
(Related Art)
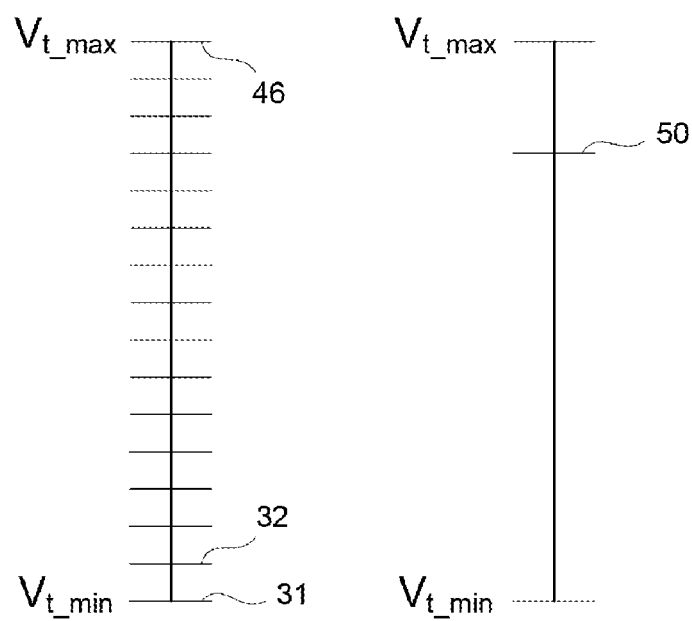

US 7,836,364 B1

CIRCUITS, ARCHITECTURES, APPARATUSES, SYSTEMS, METHODS, ALGORITHMS, SOFTWARE AND FIRMWARE FOR USING RESERVED CELLS TO INDICATE DEFECT POSITIONS

RELATED APPLICATIONS

This application claims the benefit of U.S. Provisional Application No. 60/809,208, filed May 30, 2006, incorporated herein by reference in its entirety.

FIELD OF THE INVENTION

The present invention generally relates to the field of error correction. More specifically, embodiments of the present invention pertain to circuits, systems, methods, algorithms, and software for indicating positions of defective data storage cells using reserved (e.g., "pilot") cells.

DISCUSSION OF THE BACKGROUND

Non-volatile memories such as NAND and NOR flash memories store information in a grid or array of memory cells. Generally, each cell stores a single bit, although some designs enable storage of multiple bits per cell. For example, various state-of-art flash memory architectures may be configured to hold one of $2^n$ levels in a cell, thereby effectively storing n bits of data per cell. Alternatively, some non-volatile memory architectures such as NROM store charges on both drain side and source side, and may therefore contain two bits per cell.

FIG. 1 shows a cross-sectional view of a conventional nonvolatile memory transistor 10 with a floating gate 12. Transistor 10 represents a single cell, configured to store one or more states representable as binary values (e.g., "1" or "0"). Nonvolatile memory cell 10 includes a control gate 14, gate oxide 16, floating gate 12, tunnel oxide 18, source/drain terminals 20a and 20b, and channel 22. The control gate 14 and source/drain terminals 20a and 20b each have an electrode (24 and 26a-26b, respectively) in electrical communication therewith. Programming, reading and erasing operations are all well-known to those skilled in the art. In a flash memory, the erase operation is performed on a large number of cells (e.g., a block, page or other array) simultaneously. The presence, absence or quantity of charge on the floating gate 12 changes the effective threshold voltage of the control gate 14. Reading the state of the memory cell is done by driving the control gate 14 with an appropriate voltage and measuring the resulting current across the source/drain terminals 20a and 20b, as is known in the art.

In one multi-bit nonvolatile memory architecture, the quantity of charge stored on the floating gate determines the threshold voltage of the cell and/or the amount of current that can pass through channel 22. Detection of this threshold voltage and/or current determines the state or level of the cell. During the lifespan of a non-volatile memory, the threshold voltage may change from an initial programmed value due to disturbances in the non-volatile memory transistor. To track such changes in threshold voltage and therefore minimize errors when reading back the memory, reference cells are often used. Reference cells (also known as pilot cells) refer to memory cells at pre-defined locations in an array. A pilot cell in such a multi-bit memory is typically not used for data storage, although it typically has the same physical structure as data storage cells. Rather, the pilot cell may provide a reference voltage, current or level by which the value of a data storage cell can be determined, generally by estimating the non-linear gain and/or offset of the data storage cell. As a result, each pilot cell generally has a single known or predetermined level.

FIGS. 2A-2B compare exemplary voltage levels of conventional regular data storage cells (FIG. 2A) with that of a pilot cell (FIG. 2B). For example, as shown in FIG. 2A, data storage cells may have one of 16 different levels 31-46. In contrast, the pilot cells are generally allowed to have only a single value (e.g., level 50).

Increasingly, nonvolatile memory is used for bulk data storage (e.g., flash memory cards or memory "sticks" having a data storage capacity of 256 Mb, 1 Gb or more). In such devices (and others), the cells may be defective as a result of errors in the manufacturing or) packaging process, or they may become defective after a number of write and read cycles. Defective cells can cause problems during write and/ or read processes in nonvolatile memories. Basically, information stored in defective cells may become distorted. To recover information from defective cells, a memory controller or other type of controller/processor (e.g., an encoder and/or decoder) may use an error correction code (ECC); a sophisticated defect management scheme, or both. However, such codes and schemes have limitations and/or inefficiencies.

It is therefore desirable to know which cells in a nonvolatile memory are defective, to enable use of that information either to avoid reading from and/or writing to those positions, or to indicate some status information regarding data stored in such defective cells to facilitate error recovery. Knowing the position(s) of defective cells may thus enhance the reliability and/or increase the storage efficiency of non-volatile memories. In addition, knowing the location of data from defective cells can increase error correction capability and/or efficiency, and enable use of error correction capability in a system for correction of other errors (e.g., transmission errors resulting from channel noise or interference, etc.).

SUMMARY OF THE INVENTION

Embodiments of the present invention relate to circuitry, architectures, systems, methods, algorithms, software and firmware for indicating positions of defective data storage cells using reserved (e.g., "pilot") cells. The circuit generally comprises a memory comprising a plurality of subunits, each subunit comprising a plurality of data storage cells and at least one reserved cell configured to store information identifying whether one or more of the plurality of data storage cells in the subunit are defective. In one embodiment, the circuit and/or architecture further comprise a memory controller configured to read data from and/or write data to the data storage cells, read the reserved cells, and identify positions of the defective data storage cells. The architecture generally comprises the present circuit and a communications device (e.g., a microprocessor, signal processor or encoder) in communication with the present circuit.

A further aspect of the invention concerns a method of identifying defective memory positions. The method generally comprises the steps of determining a status of data storage cells in one of a plurality of subunits in a memory (e.g., determining whether any of the data storage cells are defective), storing information regarding the status in one or more reserved cells corresponding to the one subunit, and reading the reserved cell. In various embodiments, the reserved cells differentiate between fewer voltage levels and/or store a lower density of information than the data storage cells.

Another aspect of the present invention relates to a method for encoding data, comprising the steps of receiving data from an interface, identifying a position of a defective data storage cell in a subunit of a multi-subunit memory from information stored in a reserved cell, each subunit comprising an array of data storage cells and the reserved cell, and encoding the data by a process that omits data in the defective data storage cell or leaves data in the defective data storage cell to be later marked as an erasure by the decoder. During the read back process, the decoder can ignore the defective cells if the encoder omits data in the defective data storage cells (or in the corresponding locations), or the decoder can simply treat data from defective cells as erasures. Thus, in one embodiment, the method for decoding data comprises marking the data in the defective data storage cell as one or more erasures. The algorithm(s), software, and/or firmware are generally configured to implement one or more of the present methods and/or any process or sequence of steps embodying the inventive concepts described herein.

The present invention advantageously provides a means to improve error correction capabilities by identifying defective data storage cells with already available reserved cells instead of allocating additional circuitry or resources. The present invention uses reserved cells (e.g., pilot cells) to identify the position(s) and/or location(s) of defective cells. "Pilot" or reserved cells are memory cells at known positions. Pilot cells can serve as a start point for estimating or determining a non-linear, level dependent voltage shift or non-linear, level dependent parametric change in a data storage cell. The present invention concerns a new architecture, function, capability and/or use for reserved cells to indicate one or more positions of defective data storage cells.

These and other advantages of the present invention will become readily apparent from the detailed description of preferred embodiments below.

BRIEF DESCRIPTION OF THE DRAWINGS

FIG. 1 is a diagram showing a nonvolatile floating gate memory cell suitable for use with the present invention.

FIGS. 2A-2B are graphs comparing exemplary voltage levels of data storage cells with that of a conventional pilot cell.

DETAILED DESCRIPTION OF THE PREFERRED EMBODIMENTS

Figure 3:
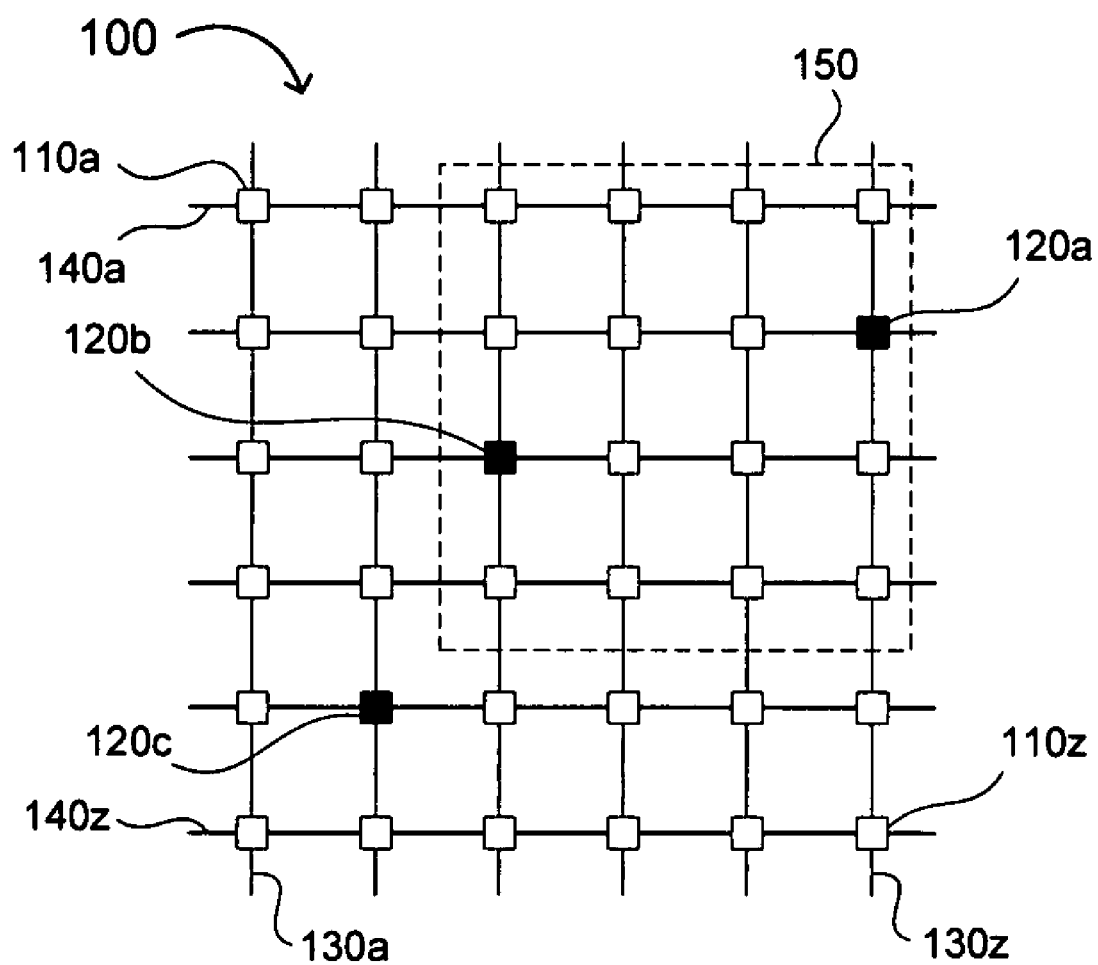
FIG. 3 is a diagram showing a preferred implementation of the present memory cell array.

Reference will now be made in detail to the preferred embodiments of the invention, examples of which are illustrated in the accompanying drawings. While the invention will be descried in conjunction with the preferred embodiments, it will be understood that they are not intended to limit the invention to these embodiments. On the contrary, the invention is intended to cover alternatives, modifications and equivalents that may be included within the spirit and scope of the invention as defined by the appended claims. Furthermore, in the following detailed description of the present invention, numerous specific details are set forth in order to provide a thorough understanding of the present invention. However, it will be readily apparent to one skilled in the art that the present invention may be practiced without these specific details. In other instances, well-known methods, procedures, components, and circuits have not been described in detail so as not to unnecessarily obscure aspects of the present invention.

Some portions of the detailed descriptions which follow are presented in terms of processes, procedures, logic blocks, functional blocks, processing, and other symbolic representations of operations on data bits, data streams or waveforms within a computer, processor, controller and/or memory. These descriptions and representations are generally used by those skilled in the data processing arts to effectively convey the substance of their work to others skilled in the art. A process, procedure, logic block, function, operation, etc., is herein, and is generally, considered to be a self-consistent sequence of steps or instructions leading to a desired and/or expected result. The steps generally include physical manipulations of physical quantities. Usually, though not necessarily, these quantities take the form of electrical, magnetic, optical, or quantum signals capable of being stored, transferred, combined, compared, and otherwise manipulated in a computer, data processing system, or logic circuit. It has proven convenient at times, principally for reasons of common usage, to refer to these signals as bits, waves, waveforms, streams, values, elements, symbols, characters, terms, numbers, or the like.

It should be borne in mind, however, that all of these and similar terms are associated with the appropriate physical quantities and are merely convenient labels applied to these quantities. Unless specifically stated otherwise and/or as is apparent from the following discussions, it is appreciated that throughout the present application, discussions utilizing terms such as "processing," "operating," "computing," "calculating," "determining," "manipulating," "transforming," "displaying" or the like, refer to the action and processes of a computer, data processing system, logic circuit or similar processing device (e.g., an electrical, optical, or quantum computing or processing device), that manipulates and transforms data represented as physical (e.g., electronic) quantities. The terms refer to actions, operations and/or processes of the processing devices that manipulate or transform physical quantities within the component(s) of a system or architecture (e.g., registers, memories, other such information storage, transmission or display devices, etc.) into other data similarly represented as physical quantities within other components of the same or a different system or architecture.

Furthermore, for the sake of convenience and simplicity, the terms "clock," "time," "rate," "period" and "frequency" are generally used interchangeably herein, but are generally given their art-recognized meanings. Also, for convenience and simplicity, the terms "data," "data stream," "waveform" and "information" may be used interchangeably, as may the terms "connected to," "coupled with," "coupled to," and "in communication with" (which terms also refer to direct and/or indirect relationships between the connected, coupled and/or communication elements unless the context of the term's use unambiguously indicates otherwise), and the terms "position" and "location," but these terms are also generally given their art-recognized meanings. In addition, the terms "store," "write" and "program," when used in the context of recording data, are also used interchangeably, and disclosure or use of one such term herein (or a grammatical variation thereof) generally includes the other terms.

The present invention concerns a circuit, architecture, system, method, algorithm and software for indicating positions of defective data storage cells using reserved cells. The circuit generally comprises a memory comprising a plurality of subunits, each subunit comprising a plurality of data storage cells and at least one reserved cell configured to store information identifying whether one or more of the plurality of data storage cells in the subunit are defective; and (optionally) a memory controller configured to read data from and/or write data to the data storage cells, identify positions of the defective data storage cells, and read and/or write the reserved cells. The architecture generally comprises the present circuit and a processor in communication therewith.

A further aspect of the invention concerns a method for identifying defective memory positions, generally comprising the steps of identifying a position of a defective data storage cell in a memory comprising a plurality of subunits; storing information identifying the position in one or more reserved cells corresponding to the subunit containing the defective data storage cell; and reading the reserved cell. Another aspect of the present invention relates to a method for encoding data, comprising the steps of accepting or receiving data from an interface, reading reserved cells in memory to identify defective data storage cells, encoding the data by a process that omits data in the defective data storage cells or that uses an error correction code (ECC), and writing the encoded data to a memory. Yet another aspect of the present invention relates to a method for decoding data, comprising the steps of reading data from a memory comprising a plurality of subunits, each subunit comprising an array of data storage cells and one or more reserved cells, identifying a position of a defective data storage cell in one or more of the subunits from information stored in the one or more reserved cells, and decoding the data by a process that omits data in the defective data storage cell or marks data in the defective data storage cell as an erasure. The algorithm(s), software, and/or firmware are generally configured to implement one or more of the present methods and/or any process or sequence of steps embodying the inventive concepts described herein.

The invention, in its various aspects, will be explained in greater detail below with regard to exemplary embodiments.

An Exemplary Memory

In one aspect, the present invention relates to a memory system, comprising a memory comprising a plurality of subunits, each subunit comprising a plurality of data storage cells and at least one reserved cell configured to store information identifying whether one or more of the plurality of data storage cells in the subunit are defective. In one embodiment, the memory system further comprises a memory controller configured to read data from and/or write data to the data storage cells, identify positions of the defective data storage cells, and read and/or write the reserved cells. Thus, the present circuit may also relate to a memory comprising a plurality of subunits, each subunit comprising a plurality of means for storing data and at least means for identifying defective means for storing data (e.g., identifying whether one or more of the means for storing data in the subunit are defective); and a means for controlling the memory, configured to read data from and/or write data to the means for storing data, identify positions of the defective means for storing data, and read the means for identifying defective means for storing data. When the memory is a nonvolatile memory, the controller may be further configured to program (e.g., write data to) and/or erase the data storage cells and the reserved cells.

In one embodiment, the reserved cell (or means for identifying defective means for storing data) is configured to store a lower density of information than each of the data storage cell, differentiate between fewer voltage levels than the data storage cell (or means for storing data), and/or store an encoded position of one or more of the defective data storage cells. In yet further embodiments, the memory controller (or means for controlling) comprises a table including position information of the reserved cells.

In an even further embodiment, the reserved cell(s), or means for identifying defective data storing means, have arbitrary positions in the memory subunit. In addition, each of the reserved cell(s) and data storage cells (or the data storing means and means for identifying defective data storing means) may comprise a transistor having one or more floating gates. These embodiments (and others) will be explained below in greater detail and with reference to the drawings.

FIG. 3 shows exemplary representation of a portion 100 of a subunit of a nonvolatile memory array, comprising data storage cells 110a-110z and one or more reserved cells 120a-120c. Although the subunit 100 may comprise an x-by-y array of nonvolatile memory cells configured as x word lines 140a-140z and y bit lines 130a-130z (by which the position of a given cell is determined), such as can be found in conventional EPROM, EEPROM and flash memories, the nonvolatile memory may also comprise a magnetic, optical or magneto-optical data storage device (e.g., a hard disk, a compact disk [CD], a digital versatile disk [DVD], ferroelectric memory, etc.). In one embodiment, the reserved cells 120a-120c may be arbitrarily assigned among the data storage cells 110a-110z in subunit 100. Alternatively, each of the reserved cells may be assigned a predetermined location, depending on the number of reserved cells needed or desired for a particular application (as explained herein). For example, the reserved cells may be located at a corner of the array 100, at an end of a word line or bit line, etc. As long as the system (e.g., a memory controller, as will be described later) knows the location of the reserved cells, the system may use the reserved cells in accordance with the invention.

The nonvolatile memory may be configured as an r-by-c array of such subunits 100, where r and c are each independently an integer. In various embodiments, the integer is at least 2, 4, 8, 16, etc. Alternatively, the nonvolatile memory may be configured as a group of z sectors or pages, where z is a number of pages conventionally found in a flash memory device or ferroelectric random access memory (FRAM), or a number of sectors conventionally found in a hard disk, CD, or DVD. As a result, nonvolatile memory is intended to encompass data storage media such as magnetic data storage media and optical data storage media.

However, in order to store or encode information regarding the position or location of defective data storage cells in the reserved cells, pilot cells might be allowed to take one of n levels, where n is smaller than the total number of levels in regular data storage cells. For example, and referring to FIG. 4A, a data storage cell may be configured to take one of sixteen (16) possible voltage levels 1 v-16 v, corresponding to a four (4)-bit cell. Here the numbers 1 v to 16 v are purely for illustrative purposes. Any other numbers between $V_{t,min}$ and $V_{t,max}$ may be used. When the data storage cell is read, the level of the cell is sensed, in many cases by comparison to one or more pilot cells having a known level. When the level output by the data storage cell is between two thresholds (e.g., 200 and 210), then the level of the cell is detected, determined and/or estimated (e.g., to be 2 v) and correlated to a state (e.g., a binary 0001 state). Accurate detection of the level stored in a given data storage cell may not always occur, as the likelihood of accurate level detection may depend on the signal-to-noise ratio (SNR) of the signal output by the cell, relative to the noise in the memory, system and/or read channel.

Reserved cells such as pilot cells that are physically identical to data storage cells have some information storage capability. However, information to be used for error correction should be very reliable. In other words, the probability that error correction information contains an error should be lower (preferably significantly lower) than the probability that the corresponding data contains an error. Therefore, a reserved cell in a nonvolatile memory architecture comprising multi-bit cells may be assigned one of a plurality of levels where the difference between adjacent levels corresponds to an acceptable probability of error for error correction information.

Figure 4A:
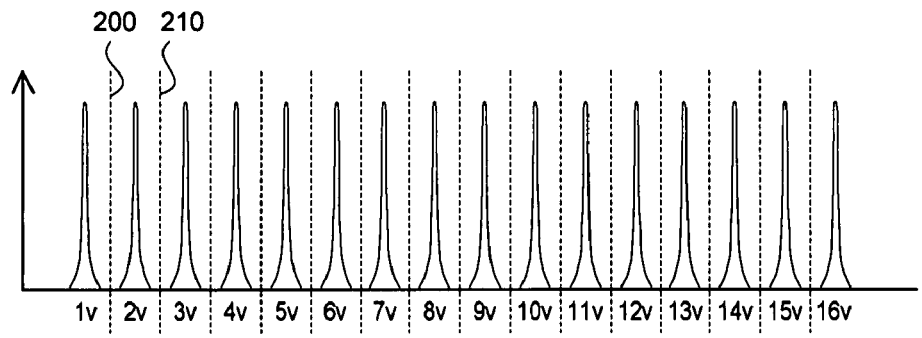
FIGS. 4A-4B are graphs comparing exemplary voltage levels of data storage cells with those of reserved cells according to the present invention.
Figure 4B:
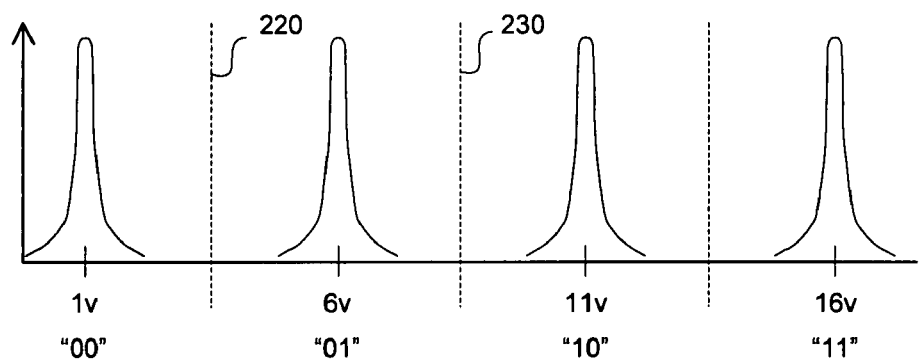

Referring now to FIG. 4B, a reserved cell in the nonvolatile memory architecture containing the multi-bit data storage cells of FIG. 4A may have four (4) levels (1 v, 6 v, 11 v, and 16 v). By doing this, the difference between adjacent levels in reserved cells (as indicated by the difference between adjacent thresholds 220 and 230) can be as much as four times greater than the difference between adjacent levels in the data storage cells. Therefore, at the input to a level detector, the signal-to-noise ratio of the reserved cells is 20*log(5)=14 dB higher than the signal-to-noise ratio for regular cells. In the example of FIG. 4B, a reserved cell with four possible levels can be treated as if it is error free.

Figure 4C:
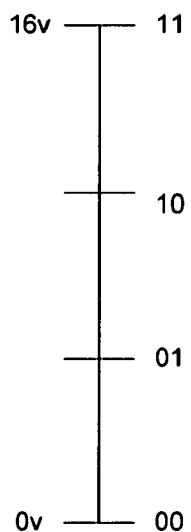
FIG. 4C shows an exemplary encoding scheme for information stored in a reserved cell in accordance with the present invention.

Referring now to FIG. 4C, the reserved cell of FIG. 4B can effectively store two (2) bits of information (00, 01, 10, or 11). Due to the large signal-to-noise ratio of the reserved cells, the reserved cell can also provide its conventional function as a reference cell for estimating or determining levels in data storage cells and/or to guide non-linear gain/offset estimation. Use of the reserved cell as shown in FIGS. 4B-4C is illustrated in an example below.

Figure 5:
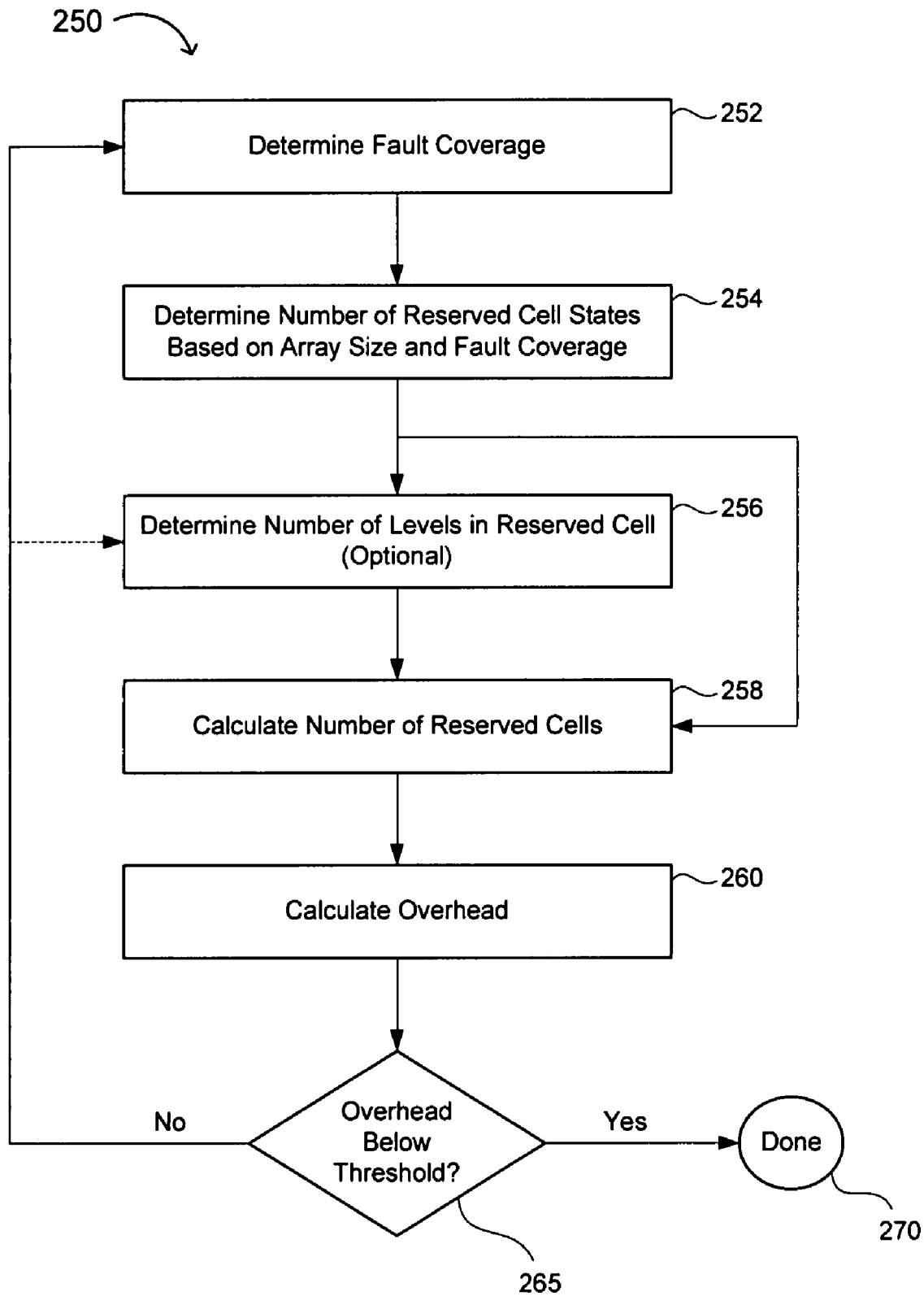
FIG. 5 is a flow chart of an exemplary process for determining an appropriate number of reserved cells for the present nonvolatile memory architecture.

More generically, however, the present memory architecture may be configured according to an exemplary algorithm represented by the flow chart 250 in FIG. 5. First, for a given nonvolatile memory, memory block or subunit having a size or density of M cells, one may determine the fault coverage, or the maximum number of cells that one wishes to mark as defective in step 252. The memory size or density may be anywhere from, e.g., 256 Byte, 512 Byte, 1 KByte, etc., to 256 MByte, 64 MByte, 16 MByte, etc., or any minimum and/or maximum value within such ranges. Generally, the larger the memory, the greater the desired level of fault coverage. When the memory size is at the lower end of the range (e.g., 256, 512, 1 k), a fault coverage as small as 1, 2 or 3 cells may be adequate. When the memory size is at the higher end of the range (e.g., 1M, 4M, 16M), a fault coverage as high as 5, 10 or 15 cells may be feasible. The fault coverage may also be determined based on maturity and/or reliability of the process technology, margins or tolerances of the storage cell levels (e.g., SNR), etc.

Next, in step 254, based on the size of the memory block M and the fault coverage selected, the number of reserved cell states that will cover all of the possible combinations of defective cells can be calculated or determined. Based on the number of levels in the reserved cells (which can be determined in step 256 or known a priori based on the number of levels of the data storage cells and the SNR between levels thereof), the number of reserved cells providing the selected fault coverage can be calculated in step 258. Finally, the overhead associated with the selected fault coverage can be calculated (e.g., by dividing the number of reserved cells by the size M of the memory). Based on design choices and/or the particular application, if the overhead is below a tolerable threshold (see decision 265), then an appropriate or acceptable fault coverage is provided or determined, and the flow is complete (270). On the other hand, if the overhead is above the threshold for the particular design and/or application (see decision 265), then the initially selected fault coverage may be too high for that particular design and/or application, and either a lower fault coverage may be selected (e.g., by returning to step 252) or, if possible, a greater number of levels may be provided in the reserved cells (e.g., by proceeding to step 256) to increase the "defective cell" marking capability. As long as the reserved cells contain more than one level, the larger the memory, the smaller the overhead for a given level of fault coverage. When the reserved cells contain more than two levels, the overhead still decreases as a function of memory size, even when the fault coverage scales directly with the memory size.

In alternate embodiments, the present nonvolatile memory includes binary memories and memories that contain 2 bits/cell. In binary nonvolatile memories (e.g., that store a digital "1" or "0" value), the reserved cells are not "pilot" cells, as that term is used with multi-level nonvolatile memory cells. In fact, the reserved cells are not necessarily located in the memory array. For example, reserved cells may be located in an area of the chip that is inaccessible to the end user. However, depending on the size of the array and the level of fault coverage, reserved cells may comprise cells at random locations in the array, or the reserved cells may be at predetermined locations in the array. For example, one row and/or column in the memory (e.g., the first or last row in a memory block) may be designated as reserved cells. When a column is designated as reserved, the array may include $2^n+1$ columns (e.g., 9 columns), or a multiple thereof (e.g., 18 columns), as is known for certain types of random access memories (e.g., dual-port memories, first-in-first-out [FIFO] memories). In either case, a memory controller can be easily configured not to store data in reserved cells when one or more rows and/or columns are designated as reserved cells.

In addition, non-volatile memory architectures that contain 2 digital, binary bits per cell (e.g., capable of storing "00," "01," "10" or "11" states) are suitable for use in the present invention. Such memories containing 2-bit cells are quite similar to conventional nonvolatile memories containing binary cells (e.g., they can be manufactured using the same process technology), and can be used in accordance with the present invention in a manner similar to binary cells as described in the preceding paragraph. However, in one implementation, the reserved cells have only two levels (i.e., they are configured to store only two of the four possible states of the 2-bit cell). For example, a reserved 2-bit cell may be configured to store only the "00" or "11" state, to ensure adequate and/or maximum SNR and/or processing margins when reading the cell. A reserved 2-bit cell that stores a "01" or "10" state may be read as a "00" or "11" state, depending on design choices and/or considerations, or it may indicate a defective reserved cell or a disallowed state for the memory.

An Exemplary Implementation

The invention can be illustrated by the following example.

FIG. 3 shows a block of sixteen memory cells 150, where each cell can hold one of sixteen voltage levels. Block 150 contains two reserved cells 120a and 120b (designated as c1 and c2 in Table 1 below), where each reserved cell can have one of four possible levels. The different levels that c1 and c2 may take can be assigned to particular defective cell location information, as shown in Table 1. Note that since the possible levels of (c1, c2) have sixteen combinations, and there are only fourteen regular data storage cells in block 150, all of the possible conditions can be indicated where there is no more than one defective cell.

TABLE 1

| (c1, c2) | Meaning |
|---|---|
| (00, 00) | No defect |
| (00, 01) | Cell #1 is defective |
| (00, 10) | Cell #2 is defective |
| (00, 11) | Cell #3 is defective |
| (01, 00) | Cell #4 is defective |
| (01, 01) | Cell #5 is defective |
| (01, 10) | Cell #6 is defective |
| (01, 11) | Cell #7 is defective |
| (10, 00) | Cell #8 is defective |
| (10, 01) | Cell #9 is defective |
| (10, 10) | Cell #10 is defective |
| (10, 11) | Cell #11 is defective |
| (11, 00) | Cell #12 is defective |
| (11, 01) | Cell #13 is defective |
| (11, 10) | Cell #14 is defective |
| (11, 11) | Not valid; can be used to detect errors or to indicate that all cells in the block of 16 cells should be marked as erasures |

In general, suppose the number of cells in the nonvolatile memory block is M, the number of voltage levels in regular data storage cells is $2^K$, and the number of voltage levels of pilot cells is $2^{(K-2)}$. Then, to mark no defect and all of the possible single defective cells, the number of reserved cells x needs to satisfy the equation $x \geq (\log_2(M-x-1))/(K-2)$. For practical designs, we can choose $x \geq \text{ceil}(\log_2(M)/(K-2))$ reserved cells are needed, where ceil(y) denotes the smallest integer greater than or equal to y. Table II shows the overhead associated with a given level of fault coverage for some exemplary values of M and K.

TABLE 2

| Block size (M) | Levels in regular cells (K) | Levels in reserved cells | # of defective cells to mark | Overhead (in # of cells) | Overhead (percentage) |
|---|---|---|---|---|---|
| 1024 | 16 | 4 | 1 | 5 | 0.49% |
| 1024 | 16 | 4 | 3 | 14 | 1.37% |
| 65536 | 16 | 4 | 1 | 8 | 0.012% |
| 65536 | 16 | 4 | 5 | 37 | 0.056% |
| 65536 | 256 | 4 | 5 | 37 | 0.056% |

As can be seen from Table 2, the overhead associated with marking defective positions is very small if the block size is big, and it does not increase with the number of levels in the data storage cells. Of course, a smaller number of levels in reserved cells can provide even more reliable reserved cell detection, but at the expense of increased overhead. Also, depending on design choices, one may reserve one or more of the states in the reserved cells (e.g., not allowing the "all 0s" or "all 1s" state to be a valid state, in which case the existence of such an invalid state can be an indicator of a defect in the reserved cell). Such restrictions may provide another tradeoff between overhead and error correction/detection reliability of the reserved cells.

Exemplary Memory Architectures

Figure 6:
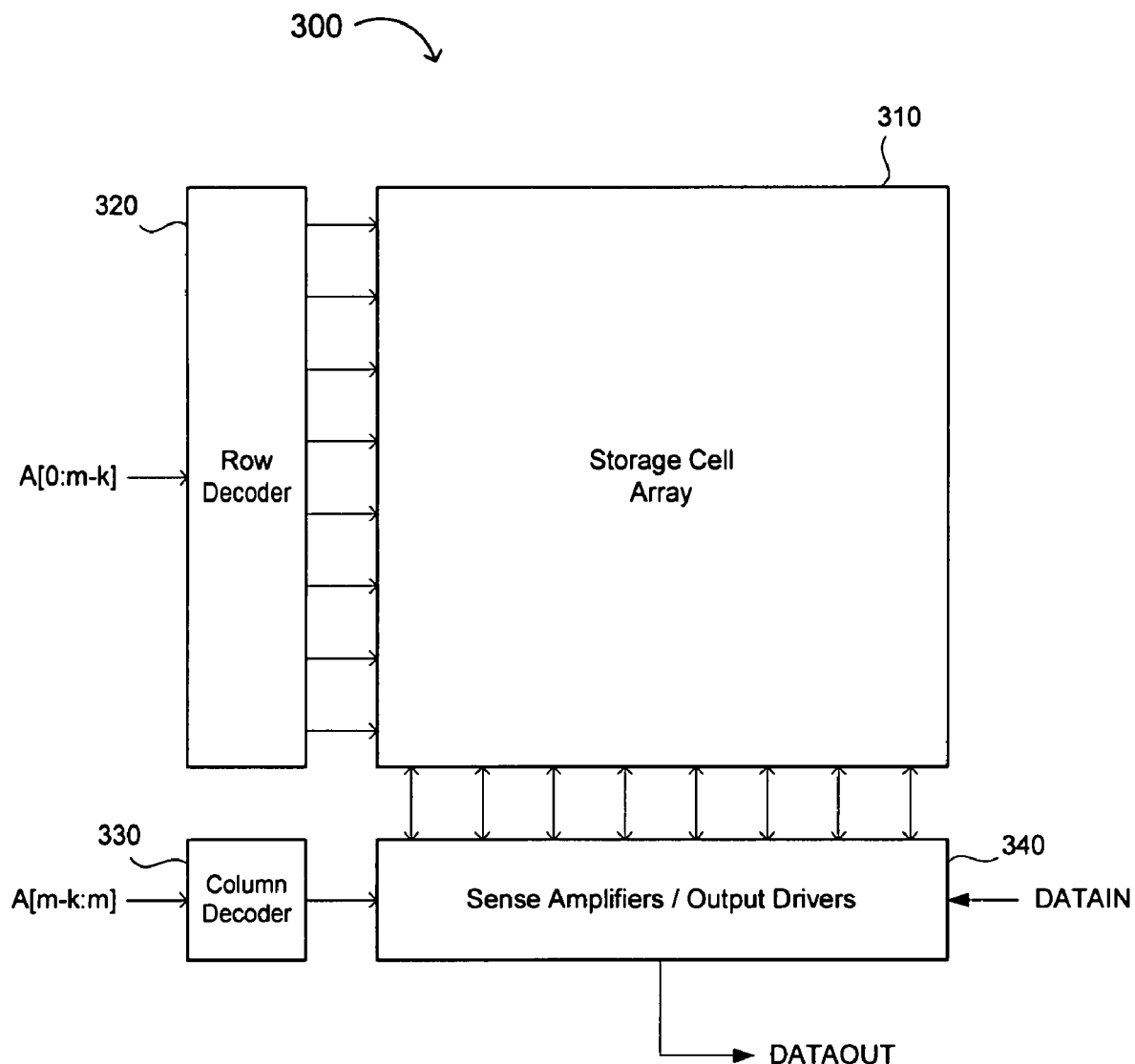
FIG. 6 is a block diagram showing an embodiment of the present memory architecture.

FIG. 6 shows an exemplary architecture 300 of the non-volatile memory. The architecture 300 includes storage cell array 310, row decoder 320, column decoder 330, sense amplifiers/output drivers 340, and control circuitry (not shown). Generally, the memory architecture 300 is conventional, and operates in a conventional manner. For example, the control circuitry may receive commands to program, erase or read one or more cells, rows, columns or subblocks of storage cell array 310. The control circuitry may then select one or more rows, columns, and/or blocks of storage cell array 310 for a program, erase or read operation, using row decoder 320, column decoder 330, and/or a block decoder (not shown). For a read operation, sense amplifiers and output drivers 340 generally output the data stored in the accessed data storage cells.

Figure 7A:
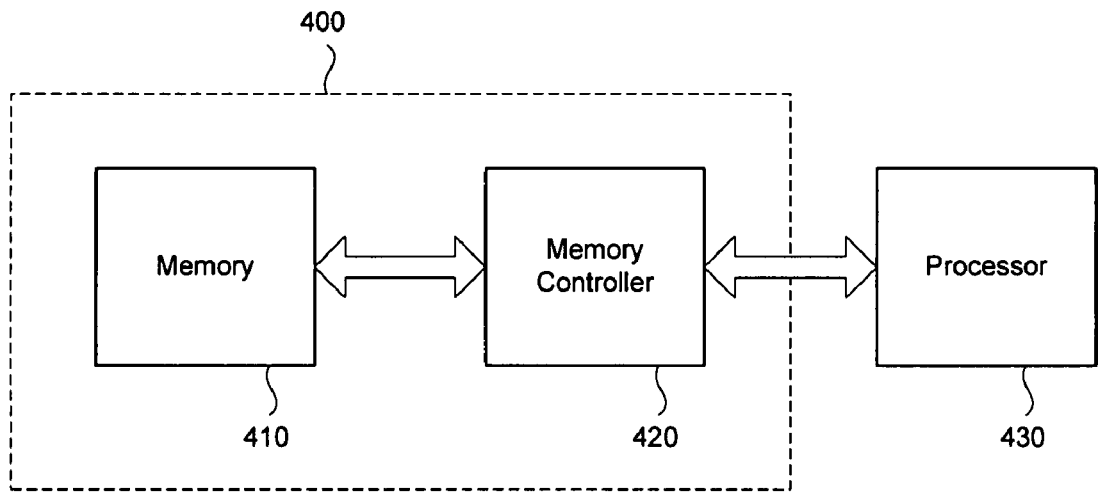
FIGS. 7A-7B are block diagrams showing exemplary architectures of the present memory system and its interaction with the processor.
Figure 7B:
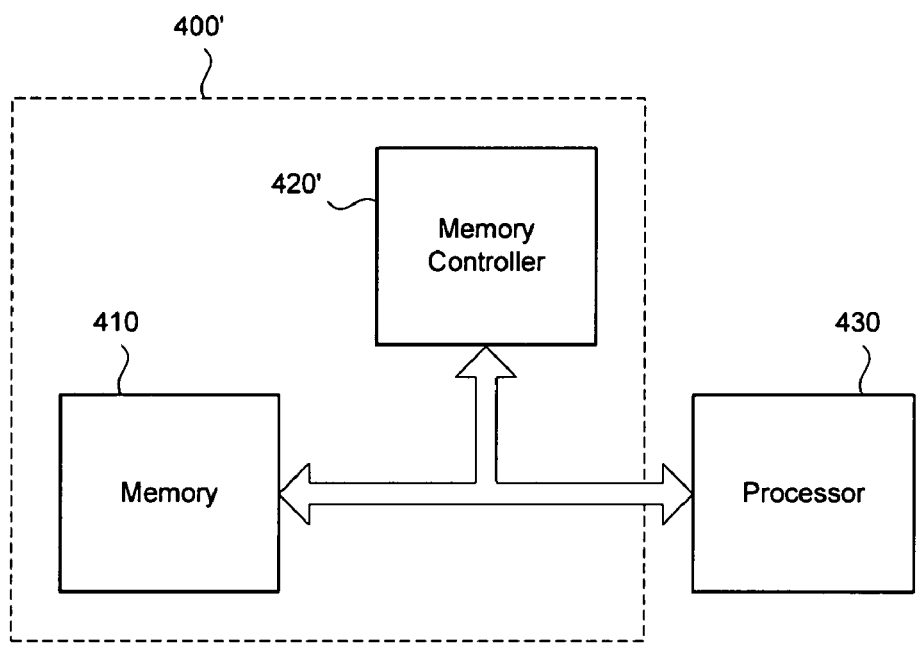

FIGS. 7A-7B shows exemplary memory system architectures 400 and 400'. The architecture 400 shown in FIG. 7A includes nonvolatile memory 410 and memory controller 420, configured to interface, with processor 430. The architecture 400' shown in FIG. 7B includes nonvolatile memory 410 and memory controller 420', configured to interface with processor 430. Memory 300 (FIG. 6) including memory array 100 (FIG. 3) are suitable for use in either architecture 400 or 400'. Generally, the processor 430 in architectures 400 and 400' runs a program and executes instructions in the program.

When a read, program or erase instruction is being executed, the processor 430 may access memory 410, through one or more instructions to memory controller 420 as shown in FIG. 7A or directly as shown in FIG. 7B. As shown in FIG. 7A, the memory controller 420 functions as an intermediary between the processor 430 and the memory 410. In a read operation, the processor 430 may have already attempted and failed to locate the data in other memories, and it accesses memory 410 by sending information to the memory controller 420. The memory controller 420 in turn attempts to access the memory 410, locate the data, acquire the data (or the address[es] of the data), and pass the data or address to the processor 430 to complete execution of the instruction.

Referring now to FIG. 7B, the memory controller 420' facilitates direct access to the memory 410 by the processor 430. The processor 430 may first attempt to obtain address information for the data from the memory controller 420' before attempting to access the memory 410, locate the data, and obtain the data directly from the memory 410 to complete execution of the instruction.

Figure 8:
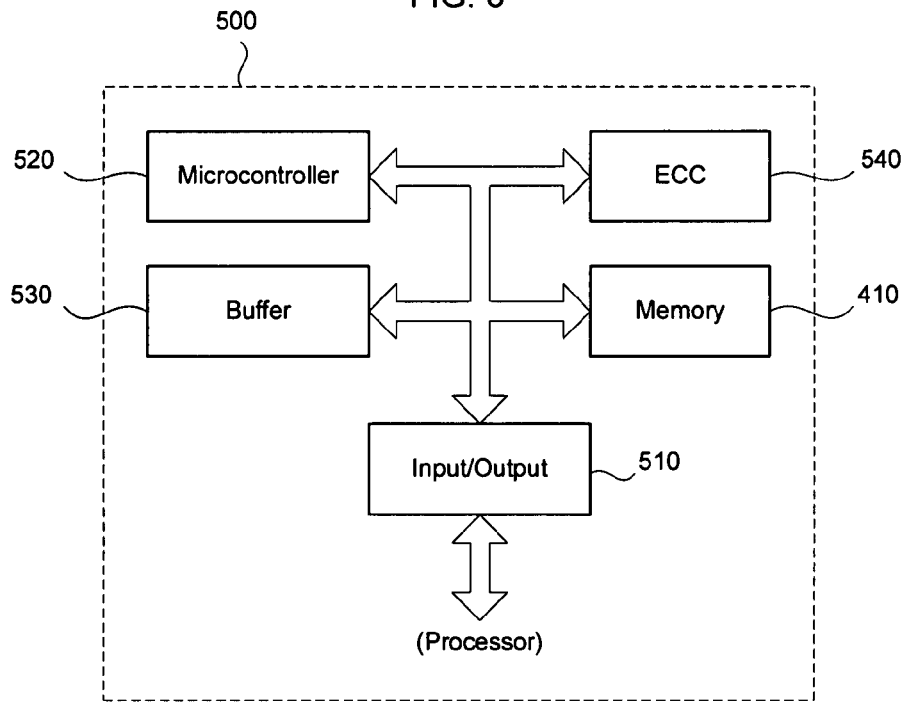
FIG. 8 is a block diagram showing an embodiment of the present memory controller with an error correction component.

FIG. 8 shows a more detailed example 500 of the memory architectures 400 and 400' of FIGS. 7A-7B. The architecture 500 includes input/output interface 510, memory 410, microcontroller 520, buffer 530, and error correction circuit (ECC) 540. Generally, the input/output interface 510 receives a request from a processor (e.g., processor 430 in FIGS. 7A-7B) to access the memory 410 to obtain data therefrom. The request (and/or any data or address information obtained) may be stored temporarily in the buffer 530 while waiting for the microcontroller 520 to become available to process the request, data or address information. Thus, the microcontroller 520 may function quite similarly to memory controller 420/420' (FIGS. 7A-7B). The buffer 530' and/or error correction circuit 540 may be configured to store the locations of the reserved cells in memory 410 (e.g., as a look-up table, in RAM, ROM, or nonvolatile memory such as EPROM, EEPROM or embedded flash memory) and/or the locations of the defective data storage cells (as a look-up table in RAM). Alternatively, such look-up tables may be stored in an internal memory of the microcontroller 520. Once the location of any defective data storage cells is stored, the corresponding data can be marked as an erasure. It is well within the abilities of one skilled in the art to design and implement logic to mark data from defective data storage cells as erasures.

At any time after the microcontroller 520 processes the request from the processor and/or reads or retrieves data from the memory 410, the microcontroller 520 may obtain the positions of the reserved cells of the subunit[s] being processed from the buffer 530, error correction circuit 540, or internal memory of the microcontroller 520, and control transmission of information from those reserved cells to the error correction circuit 540. The error correction circuit 540 may determine whether one or more subunits of the memory 410 contains any defective data storage cells from the information in the reserved cells. After the information identifying any defective data storage cells is obtained, the error correction circuit may instruct the memory controller 520 to avoid reading and/or writing to positions of defective data storage cells (e.g., mark the locations of such cells with a "Do Not Read/Program" indicator). Additionally or alternatively, the error correction circuit 540 may mark the positions of (or data from) defective data storage cells in memory 410 as erasures. During error recovery or correction at a remote device or apparatus with error correction processing capability, such as the capability to process data with parity bits, Cyclic Redundancy Code, low-density parity-check (LDPC) codes, Bose-Chowdhury-Hocquenghem (BCH) codes, or Reed-Solomon Error Correction Code, the remote device or apparatus receiving the data can process the data and correct the erasures relatively easily.

Thus, the present circuit may further comprise an error correction code circuit configured to identify locations of data from the defective data storage cells (e.g., insert or encode error indicators) in a data stream formed from the memory, and/or a decoder configured to identify, detect and/or process error indicators during program, read and/or erase operations of the memory. Alternatively, the present circuit may further comprise a means for enabling error correction in a data stream from the memory, and/or a means for identifying, detecting and/or processing error indicators from the data stream. As a consequence, the present system may be configured to identify positions of the error indicators in the data stream from the positions of the defective data storage cells.

Exemplary Systems

In a further aspect of the present invention, the system generally comprises the present memory, a signal processing or control system, and input/output interfaces configured for a wide variety of applications. Thus, as an alternative to the local error correction encoding functions described with regard to FIGS. 7A-7B and 8, erasure positions or other error indications may be marked in a circuit block relatively remote from the present nonvolatile memory. Consequently, the present system may include a transmitter and/or a receiver, and the transmitter may comprise an error correction circuit (e.g., an ECC encoder), and the receiver may be configured to mark data from defective data storage cells as erasures. Alternatively, the present transceiver may comprise the present circuit as described herein, a means for transmitting serial data to a network, a means for receiving serial data from the network, and a means for generating or providing a reference clock signal to the means for transmitting and the means for receiving. Furthermore, the transmitter may be configured to convert parallel data from the device to serial data for the network, the receiver may be configured to convert serial data from the network to parallel data for a device, and the transceiver may be embodied on a single integrated circuit.

Figure 9:
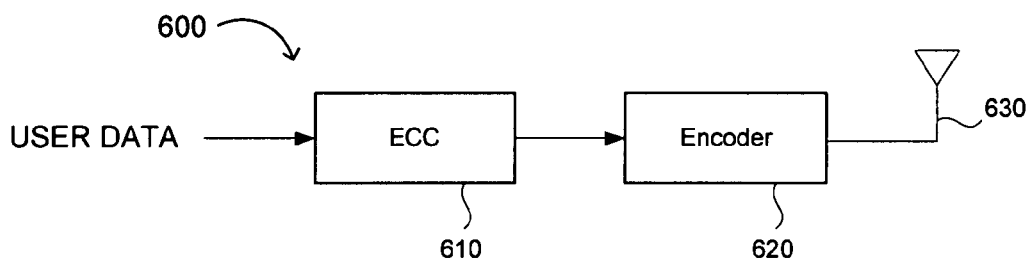
FIG. 9 is a block-level diagram showing an encoding system with an error correction component, suitable for use with the present invention.

FIG. 9 shows a transmitter architecture 600, including error correction circuit (ECC) 610, encoder 620, and antenna 630. Although the transmitter architecture 600 is configured for wireless data transmissions, the present invention is also suitable for use in wired data transmission systems (e.g., data storage systems, Ethernet-based networks, computer-to-printer or peripheral device-to-printer transmissions, etc.). Data (e.g., USER DATA) is retrieved from the non-volatile memory (e.g., nonvolatile memory 300 as shown in FIG. 6), usually as a multi-bit signal (e.g., having a width of 8 or 16 bits, although other bits widths or serial data are also acceptable). The error correction circuit (ECC) 610 then obtains the location(s) of any defective cells (e.g., from a look-up table or other memory within the ECC block 610 or associated with a memory controller, such as memory controller 420 or 420', as shown in FIGS. 7A-7B) and marks the corresponding data as erasures in a conventional manner. Thereafter, a conventional data encoder 620 encodes the data (e.g., in accordance with one or more of the above-identified codes, such as convolutional code), and the encoded data (with erasure positions marked) is transmitted via antenna 630, typically as a serial data stream. The data stream transmitted via antenna 630 may be analog or digital, and if digital, binary or non-binary (e.g., comprising a series of non-binary symbols).

Figure 10:
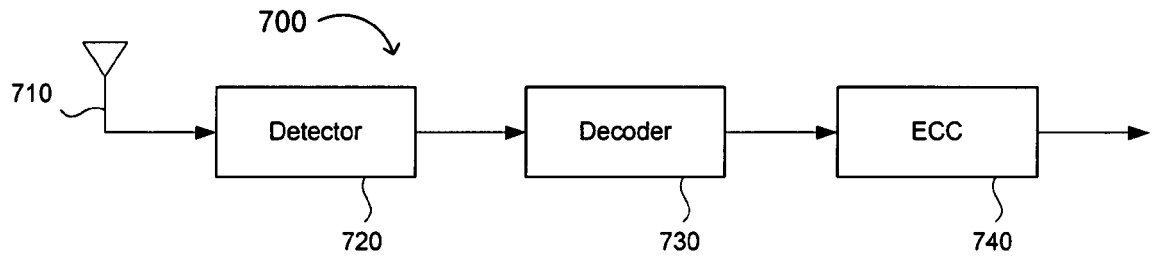
FIG. 10 is a block-level diagram showing a data receiving system with an error correction component, suitable for use with the present invention.

FIG. 10 shows a receiver architecture 700, including antenna 710, detector 720, data decoder 730, and error correction circuit (ECC) 740. Although the receiver architecture 700 is configured for wireless data reception, the present invention is also suitable for use in wired data transmission systems (e.g., as described herein). A data signal received by antenna 710 (typically, an analog data stream, but which may be a binary or non-binary digital data stream) is sampled by detector 720 from the non-volatile memory (e.g., nonvolatile memory 300 as shown in FIG. 6). The sampled values of the data signal are then sent via a serial or parallel bus to a conventional decoder 730, which decodes the data (e.g., in accordance with one or more of the above-identified codes, such as convolutional code). Thereafter, the decoded data (with erasure positions identified) is sent to error correction circuit (ECC) 740, typically as a parallel (multi-bit) signal, where it is processed in accordance with one or more conventional ECC circuits and/or algorithms.

A further aspect of the invention concerns a network, comprising (a) a plurality of the present systems, communicatively coupled to each other; and (b) a plurality of storage or communications devices, wherein each storage or communications device is communicatively coupled to one of the systems. The network may be any kind of known network, such as a storage network (e.g., RAID array), Ethernet, or wireless network, but preferably, the network comprises a storage network. The network may further include any known storage or communications device, but preferably, at least a plurality of the coupled devices comprise nonvolatile data storage devices. Alternatively, the present system may comprising the present transceiver, a first port (or means for communicating serial data) coupled to the transmitter (or means for transmitting), and a second port (or means for communicating serial data) coupled to the receiver (or means for receiving). Similarly, the network may comprise a plurality of the present systems, communicatively coupled to each other, and a plurality of storage devices (or means for bulk data storage) and/or communications devices (or means for communicating high-speed data), each of which is communicatively coupled to one of the systems.

Figure 11A:
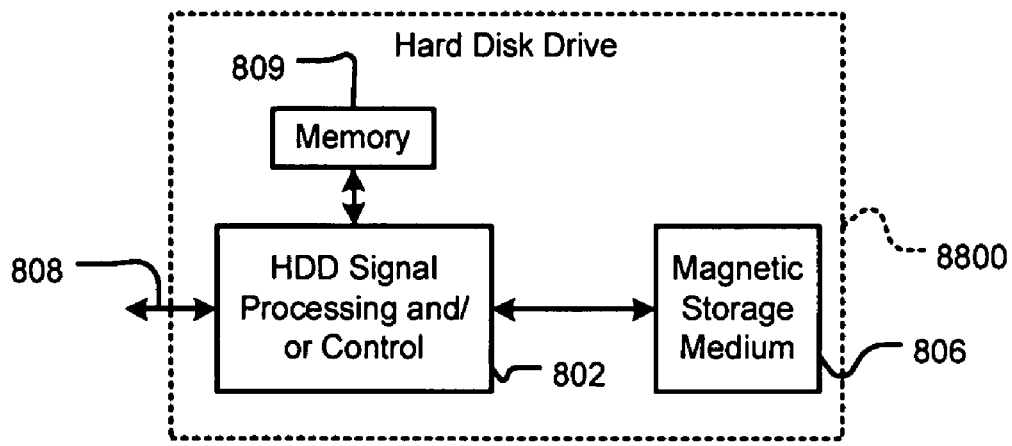
FIG. 11A is a diagram of an exemplary hard disk drive.

Various exemplary implementations of the present invention are shown in FIGS. 11A-11G. Referring now to FIG. 11A, the present invention can be implemented in a hard disk drive (HDD) 800. The present invention may implement either or both signal processing and/or control circuits, which are generally identified in FIG. 11A at 802. In some implementations, the signal processing and/or control circuit 802 and/or other circuits (not shown) in the HDD 800 may process data, correct errors, tag or mark defective memory cells, perform coding and/or encryption, perform calculations, and/or format data that is output to and/or received from a magnetic storage medium 806.

The HDD 800 may communicate with a host device (not shown) such as a computer, mobile computing devices such as personal digital assistants, cellular phones, media or MP3 players and the like, and/or other devices via one or more wired or wireless communication links 808. The HDD 800 may be connected to memory 809 such as random access memory (RAM), low latency nonvolatile memory such as flash memory (for which the present invention may also be implemented), read only memory (ROM) and/or other suitable electronic data storage.

Figure 11B:
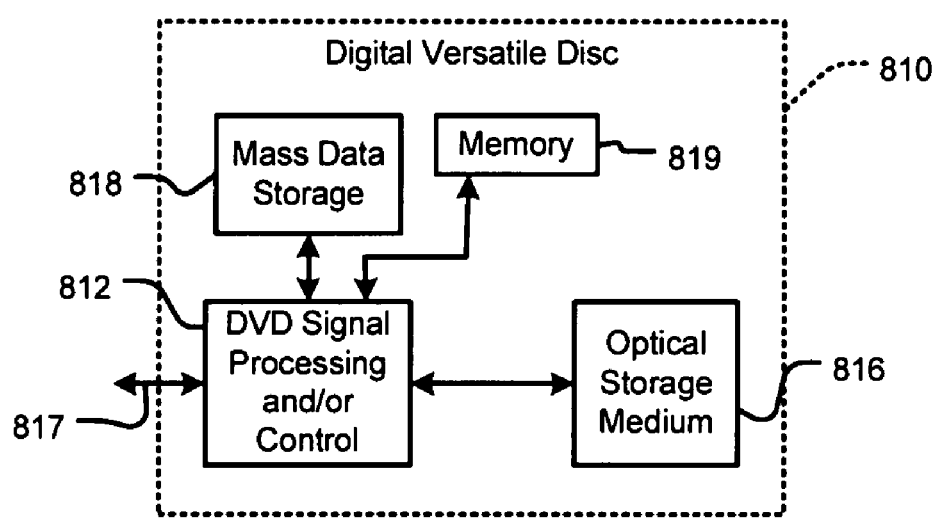
FIG. 11B is a diagram of an exemplary digital versatile disc (DVD) player.

Referring now to FIG. 11B, the present invention can be implemented in a digital versatile disc (DVD) drive 810. The present invention may implement either or both signal processing and/or control circuits, which are generally identified in FIG. 11B at 812, and/or mass data storage of the DVD drive 810. The signal processing and/or control circuit 812 and/or other circuits (not shown) in the DVD 810 may process data, correct errors, tag or mark defective memory cells, perform coding and/or encryption, perform calculations, and/or format data that is read from and/or data written to an optical storage medium 816. In some implementations, the signal processing and/or control circuit 812 and/or other circuits (not shown) in the DVD 810 can also perform other functions such as encoding and/or decoding and/or any other signal processing functions associated with a DVD drive.

The DVD drive 810 may communicate with an output device (not shown) such as a computer, television or other device via one or more wired or wireless communication links 817. The DVD 810 may communicate with mass data storage 818 that stores data in a nonvolatile manner. The mass data storage 818 may include a hard disk drive (HDD). The HDD may have the configuration shown in FIG. 11A. The HDD may be a mini HDD that includes one or more platters having a diameter that is smaller than approximately 1.8". The DVD 810 may be connected to memory 819 such as RAM, ROM, low latency nonvolatile memory such as flash memory (for which the present invention may also be implemented) and/or other suitable electronic data storage.

Figure 11C:
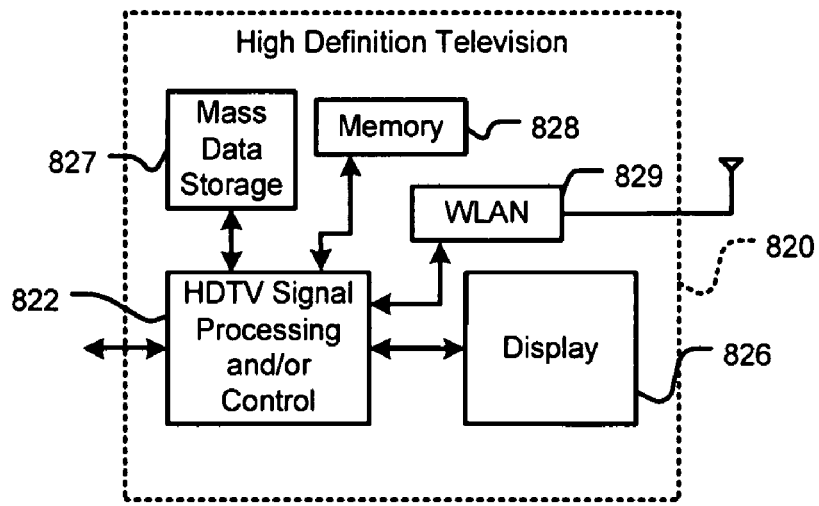
FIG. 11C is a diagram of an exemplary high definition television (HDTV).

Referring now to FIG. 11C, the present invention can be implemented in a high definition television (HDTV) 820. The present invention may implement either or both signal processing and/or control circuits, which are generally identified in FIG. 11E at 822, a WLAN interface and/or mass data storage of the HDTV 820. The HDTV 820 receives HDTV input signals in either a wired or wireless format and generates HDTV output signals for a display 826. In some implementations, signal processing circuit and/or control circuit 822 and/or other circuits (not shown) of the HDTV 820 may process data, correct errors, tag or mark defective memory cells, perform coding and/or encryption, perform calculations, format data and/or perform any other type of HDTV processing that may be required.

The HDTV 820 may communicate with mass data storage 827 that stores data in a nonvolatile manner such as optical and/or magnetic storage devices. At least one HDD may have the configuration shown in FIG. 11A and/or at least one DVD may have the configuration shown in FIG. 11B. The HDD may be a mini HDD that includes one or more platters having a diameter that is smaller than approximately 1.8". The HDTV 820 may be connected to memory 828 such as RAM, ROM, low latency nonvolatile memory such as flash memory (for which the present invention may also be implemented) and/or other suitable electronic data storage. The HDTV 820 also may support connections with a WLAN via a WLAN network interface 829.

Figure 11D:
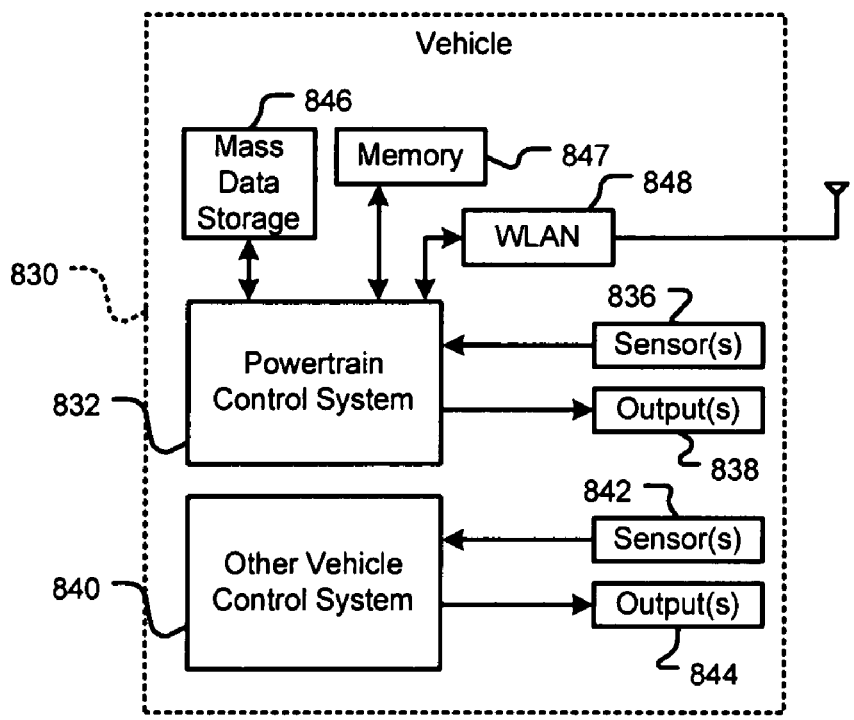
FIG. 11D is a diagram of an exemplary vehicle control system.

Referring now to FIG. 11D, the present invention implements a control system of a vehicle 830, a WLAN interface and/or mass data storage of the vehicle control system. In some implementations, the present invention implement a powertrain control system 832 that receives inputs from one or more sensors such as temperature sensors, pressure sensors, rotational sensors, airflow sensors and/or any other suitable sensors and/or that generates one or more output control signals such as engine operating parameters, transmission operating parameters, and/or other control signals.

The present invention may also be implemented in other control systems 840 of the vehicle 830. The control system 840 may likewise receive signals from input sensors 842 and/or output control signals to one or more output devices 844. In some implementations, the control system 840 may be part of an anti-lock braking system (ABS), a navigation system, a telematics system, a vehicle telematics system, a lane departure system, an adaptive cruise control system, a vehicle entertainment system such as a stereo, DVD, compact disc and the like. Still other implementations are contemplated.

The powertrain control system 832 may communicate with mass data storage 846 that stores data in a nonvolatile manner. The mass data storage 846 may include optical and/or magnetic storage devices (for example, hard disk drives [HDDs] and/or DVDs). At least one HDD may have the configuration shown in FIG. 11A and/or at least one DVD may have the configuration shown in FIG. 11B. The HDD may be a mini HDD that includes one or more platters having a diameter that is smaller than approximately 1.8". The powertrain control system 832 may be connected to memory 847 such as RAM, ROM, low latency nonvolatile memory such as flash memory (for which the present invention may also be implemented) and/or other suitable electronic data storage. The powertrain control system 832 also may support connections with a WLAN via a WLAN network interface 848. The control system 840 may also include mass data storage, memory and/or a WLAN interface (all not shown).

Figure 11E:
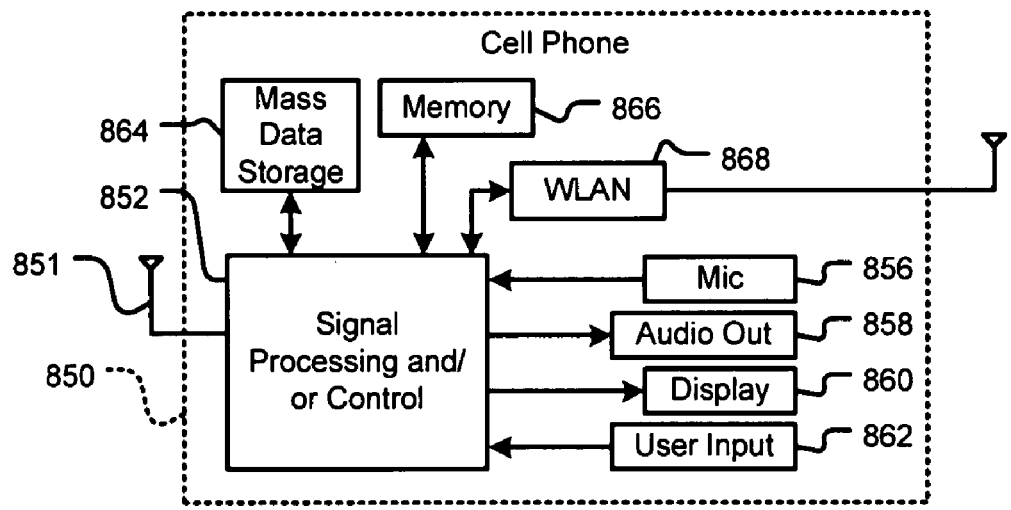
FIG. 11E is a diagram of an exemplary cellular or mobile phone.

Referring now to FIG. 11E, the present invention can be implemented in a cellular phone 850 that may include a cellular antenna 851. The present invention may implement either or both signal processing and/or control circuits, which are generally identified in FIG. 11E at 852, a WLAN interface and/or mass data storage of the cellular phone 850. In some implementations, the cellular phone 850 includes a microphone 856, an audio output 858 such as a speaker and/or audio output jack, a display 860 and/or an input device 862 such as a keypad, pointing device, voice actuation and/or other input device. The signal processing and/or control circuits 852 and/or other circuits (not shown) in the cellular phone 850 may process data, correct errors, tag or mark defective memory cells, perform coding and/or encryption, perform calculations, format data and/or perform other cellular phone functions.

The cellular phone 850 may communicate with mass data storage 864 that stores data in a nonvolatile manner such as optical and/or magnetic storage devices (for example, hard disk drives [HDDs] and/or DVDs). At least one HDD may have the configuration shown in FIG. 11A and/or at least one DVD may have the configuration shown in FIG. 11B. The HDD may be a mini HDD that includes one or more platters having a diameter that is smaller than approximately 1.8". The cellular phone 850 may be connected to memory 866 such as RAM, ROM, low latency nonvolatile memory such as flash memory (for which the present invention may also be implemented) and/or other suitable electronic data storage. The cellular phone 850 also may support connections with a WLAN via a WLAN network interface 868.

Figure 11F:
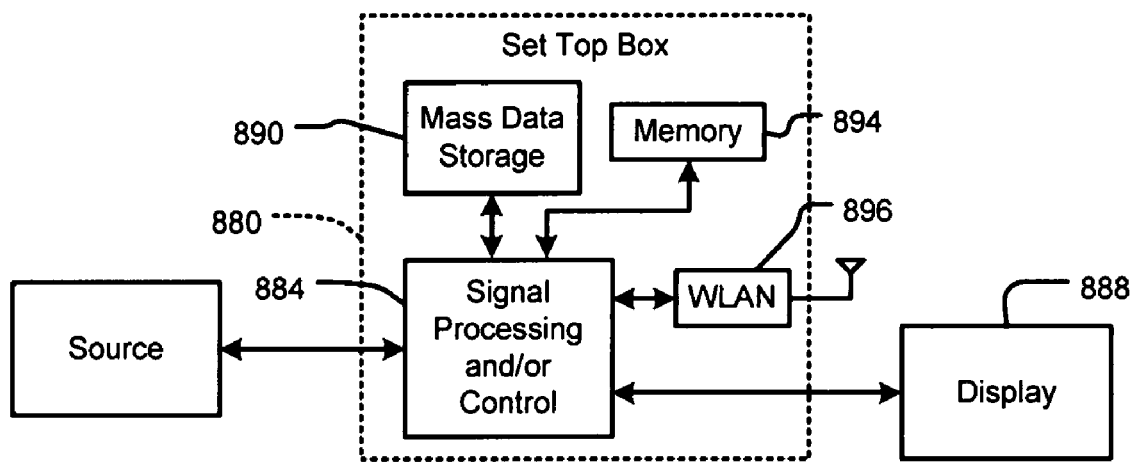
FIG. 11F is a diagram of an exemplary television set top box.
Figure 11G:
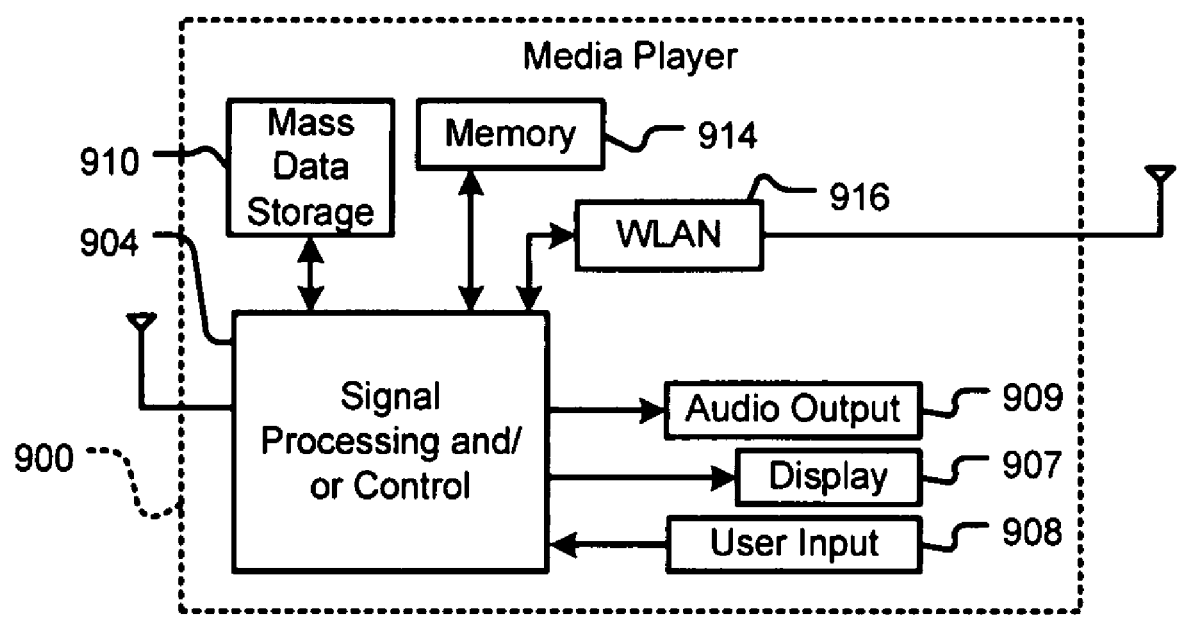
FIG. 11G is a diagram of an exemplary portable media player.

Referring now to FIG. 11F, the present invention can be implemented in a set top box 880. The present invention may implement either or both signal processing and/or control circuits, which are generally identified in FIG. 11F at 884, a WLAN interface and/or mass data storage of the set top box 880. The set top box 880 receives signals from a source such as a broadband source and outputs standard and/or high definition audio/video signals suitable for a display 888 such as a television and/or monitor and/or other video and/or audio output devices. The signal processing and/or control circuits 884 and/or other circuits (not shown) of the set top box 880 may process data, correct errors, tag or mark defective memory cells, perform coding and/or encryption, perform calculations, format data and/or perform any other set top box function.

The set top box 880 may communicate with mass data storage 890 that stores data in a nonvolatile manner. The mass data storage 890 may include optical and/or magnetic storage devices (for example, hard disk drives [HDDs] and/or DVDs). At least one HDD may have the configuration shown in FIG. 11A and/or at least one DVD may have the configuration shown in FIG. 11B. The HDD may be a mini HDD that includes one or more platters having a diameter that is smaller than approximately 1.8". The set top box 880 may be connected to memory 894 such as RAM, ROM, low latency nonvolatile memory such as flash memory (for which the present invention may also be implemented) and/or other suitable electronic data storage. The set top box 880 also may support connections with a WLAN via a WLAN network interface 896.

Referring now to FIG. 11F, the present invention can be implemented in a media player 900. The present invention may implement either or both signal processing and/or control circuits, which are generally identified in FIG. 11G at 904, a WLAN interface and/or mass data storage of the media player 900. In some implementations, the media player 900 includes a display 907 and/or a user input 908 such as a keypad, touchpad and the like. In some implementations, the media player 900 may employ a graphical user interface (GUI) that typically employs menus, drop down menus, icons and/or a point-and-click interface via the display 907 and/or user input 908. The media player 900 further includes an audio output 909 such as a speaker and/or audio output jack. The signal processing and/or control circuits 904 and/or other circuits (not shown) of the media player 900 may process data, correct errors, tag or mark defective memory cells, perform coding and/or encryption, perform calculations, format data and/or perform any other media player function.

The media player 900 may communicate with mass data storage 910 that stores data such as compressed audio and/or video content in a nonvolatile manner. In some implementations, the compressed audio files include files that are compliant with MP3 format or other suitable compressed audio and/or video formats. The mass data storage may include optical and/or magnetic storage devices (for example, hard disk drives [HDDs] and/or DVDs). At least one HDD may have the configuration shown in FIG. 11A and/or at least one DVD may have the configuration shown in FIG. 11B. The HDD may be a mini HDD that includes one or more platters having a diameter that is smaller than approximately 1.8". The media player 900 may be connected to memory 914 such as RAM, ROM, low latency nonvolatile memory such as flash memory (for which the present invention may also be implemented) and/or other suitable electronic data storage. The media player 900 also may support connections with a WLAN via a WLAN network interface 916. Still other implementations in addition to those described above are contemplated.

Exemplary Methods

The present invention further relates to a method of identifying defective memory positions, comprising the steps of determining a status of data storage cells in one of a plurality of subunits in a memory, storing information regarding the status of the data storage cells in a reserved cell corresponding to the subunit, and reading the reserved cell. In one embodiment, the status concerns whether any data storage cells in the subunit are defective, and the information identifies whether one or more of the data storage cells in the subunit are defective. In various other embodiments, the reserved cells differentiate between fewer voltage levels and/or store a lower density of information than the data storage cells. In addition, the information may comprise a position of the defective data storage cells and/or encoded information including a number of defective data storage cells in the subunit. When the number of defective data storage cells is at least 1, the encoded information may include location(s) of the defective data storage cell(s). Further embodiments of the present method of identifying defective memory positions may comprise the step(s) of storing information identifying a position of the reserved cell in a memory controller, disabling the capability to perform read and/or write operations to the position identified by the reserved cell, and/or marking the defect position identified by the reserved cell as an erasure during an error recovery step. As for the exemplary memory, the method may determine the status of a plurality of data storage cells, store information regarding the status in a plurality of reserved cells in the subunit, read the reserved cells, and/or identify whether one or more of the plurality of data storage cells in the subunit are defective.

Another aspect of the present invention relates to a method for decoding data, comprising the steps of reading data from a memory comprising a plurality of subunits, each subunit comprising an array of data storage cells and one or more reserved cells, identifying a position of a defective data storage cell in one or more of the subunits from information stored in the one or more reserved cells, and decoding the data by a process that omits data in the defective data storage cell or marks data in the defective data storage cell as an erasure. In one embodiment, the method for decoding data comprises marking the data in the defective data storage cell as one or more erasures. In yet another embodiment, the decoder treats the data in defective cells as regular data and uses one or more error correction codes and/or techniques to correct the bit errors in the defective cells. As will be seen with regard to the description of FIGS. 12-13 below, further embodiments of the present method may further comprise the step(s) of transmitting the encoded data and the erasure(s), receiving the encoded data and the erasure(s), decoding the received data and the erasure(s), identifying the erasure(s), and/or error correcting the received data.

Figure 12:
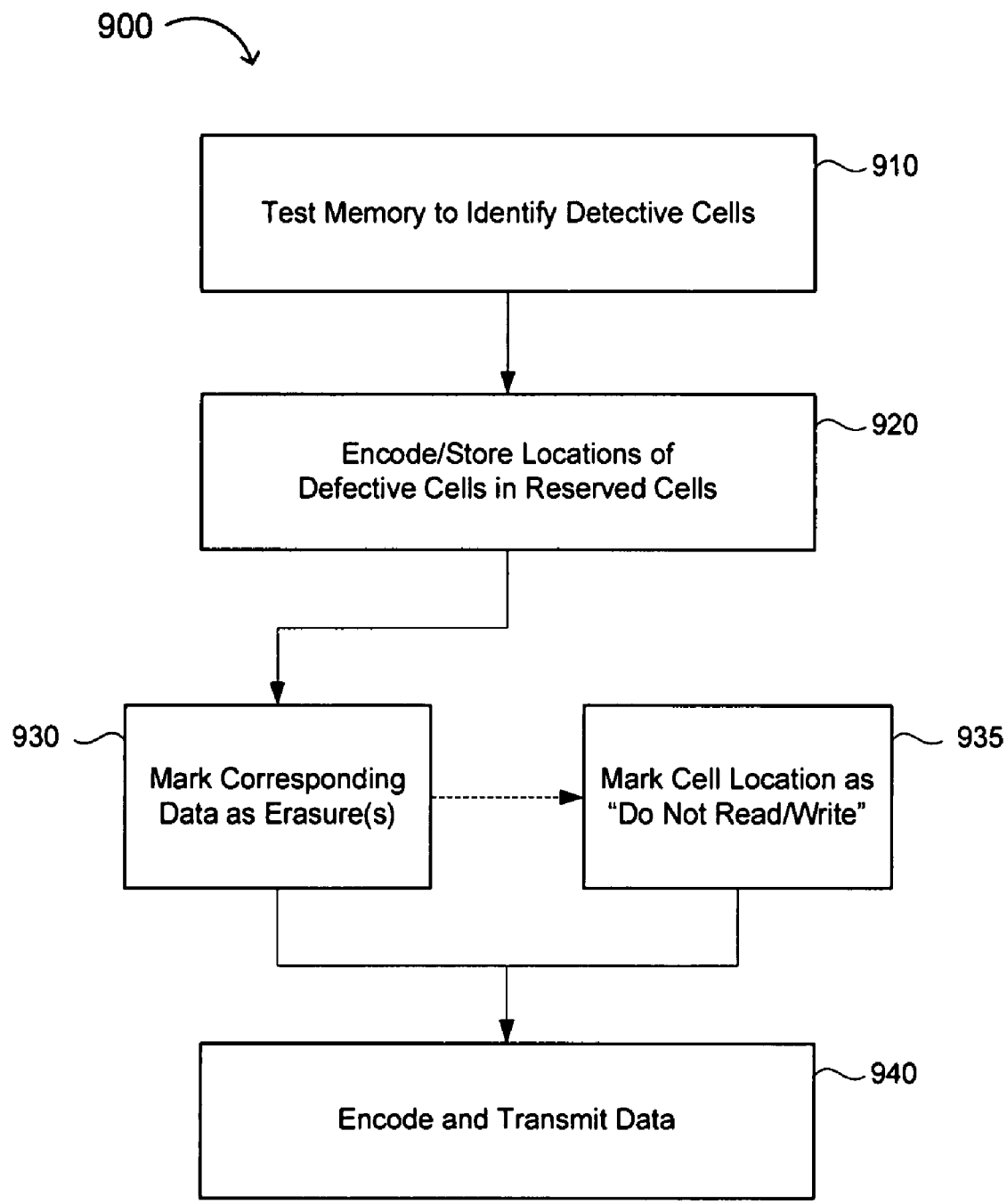
FIG. 12 is a flow chart of an exemplary process for marking defective data storage cells using reserved cells in accordance with an embodiment of the present invention.

FIG. 12 shows a flow chart 900 for storing, retrieving and encoding data using the present memory. Once the memory is fabricated and capable of programming/storing, reading and erasing operations, the non-volatile memory is tested conventionally to determine the locations of the defective data storage cells in step 910. Thereafter, in step 920, data is stored in the memory, and the locations of the defective data storage cells are stored in the reserved cells. If there are more defective cells in the memory than maximum "defective cell location" capacity of the reserved cells, an indicator (e.g., information such as a particular state) is written to the reserved cells indicating this state (e.g., identifying the entire nonvolatile memory sector or block as being defective). Similarly, if there are no defective cells in the memory, an indicator may be written to the reserved cells indicating this state (e.g., identifying all data in the nonvolatile memory sector or block as being valid).

When the reserved cells store the locations of at least one defective data storage cell (up to the maximum number of defective data storage cells), in step 930, the memory controller may mark the data stored in the locations of the defective data storage cells as erasures. In step 935, the memory controller may mark the locations of the defective data storage cells as locations for which programming, reading and/or erasing operations need not be performed (e.g., "Do Not Read/Write" location[s]). Finally, in step 940, the data is conventionally encoded, and the data from the defective cells is omitted or marked (e.g., in error correction code such as cyclic redundancy code [CRC] or BCH codes) as erasures. Thus, the data may be encoded by a process that omits data stored in the defective data storage cell(s) from a subsequently produced, encoded data stream. Exemplary codes include block codes, cyclic codes and convolutional codes. Suitable codes for encoding the data include Hamming codes, Hadamard codes, Golay code, Bose-Chowdhury-Hocquenghem (BCH) codes, Reed-Solomon code, LDPC codes, etc. Typically, the erasure information is encoded in the error correction code associated with the block or sector of data, and is generally included in a footer of a data or information block to be transmitted over a channel (e.g., a read channel of a data storage system, a transmission channel of a wired or wireless network, etc.).

Figure 13:
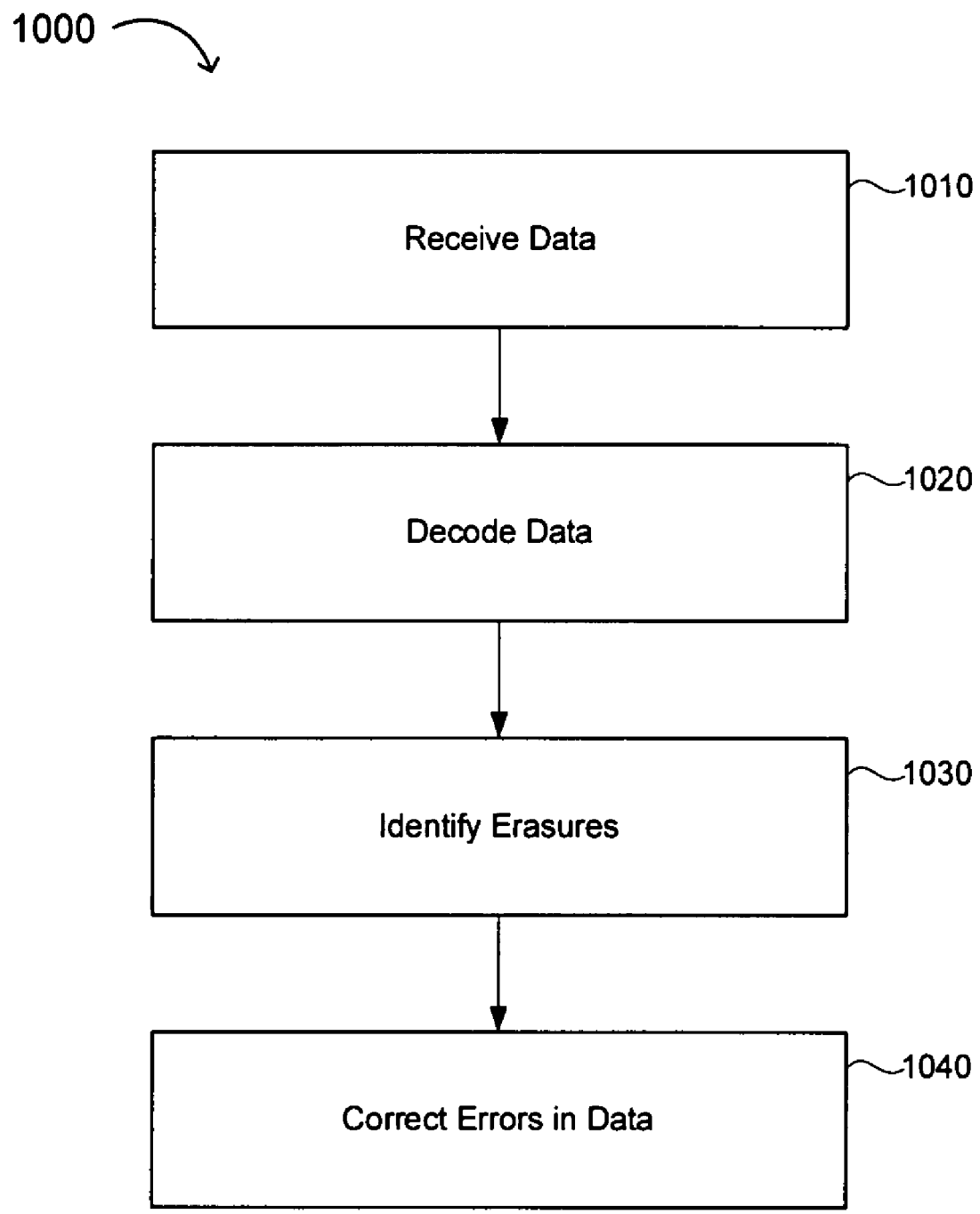
FIG. 13 is a flow chart of an exemplary error correction process in accordance with an embodiment of the present invention.

FIG. 13 shows a flow chart 1000 for decoding data retrieved or read from the present non-volatile memory and encoded as described herein. First, the data is received in step 1010. Once the data is received (e.g., as either a binary bitstream or a sampled analog waveform), it is decoded in step 1020, and the accompanying erasures (and/or their locations) are identified in step 1030. Thereafter, errors in the decoded data are corrected (e.g., in an ECC or CRC decoder) in step 1040.

As mentioned above, identifying the positions of unreliable data (e.g., from defective cells) greatly improves the error correction power of a receiver (e.g., the ECC or CRC decoder within the receiver). In addition, marking data from defective cells as erasures effectively doubles the error correction power or capability of the receiver. For example, if a receiver operating on a block, sector or segment of code has the power or capability to correct up to 10 erroneous bits, the receiver also generally has the power or capability to correct up to 20 erasures.

Exemplary Software and Firmware

The present invention also includes algorithms, computer program(s) software, and/or firmware, implementable and/or executable in a general purpose computer or workstation equipped with a conventional digital signal processor, configured to perform one or more steps of the method and/or one or more operations of the hardware. Thus, a further aspect of the invention relates to algorithms, software, and/or firmware that implement the above method(s). For example, the invention may further relate to a computer program, computer-readable medium or waveform containing a set of instructions which, when executed by an appropriate processing device (e.g., a signal processing device, such as a microcontroller, microprocessor or DSP device), is configured to perform the above-described method and/or algorithm. In certain embodiments, the computer program or waveform may comprise one or more instructions to compile a data stream containing data from the data storage cells of the memory subunit and/or to mark data from the defective data storage cells as an erasure. In the context of this disclosure, "firmware" has its ordinary meaning, and may refer to configurable hardware that, depending on its configuration (which is often implemented by programming configuration bits and/or modifying an electronic representation of the circuit, such as a VERILOG or Hardware Description Language representation), can provide one or more of a plurality of possible functions and/or performance characteristics.

For example, the computer program may be on any kind of readable medium, and the computer-readable medium may comprise any medium that can be read by a processing device configured to read the medium and execute code stored thereon or therein, such as a floppy disk, CD-ROM, magnetic tape or hard disk drive. Such code may comprise object code, source code and/or binary code.

The waveform is generally configured for transmission through an appropriate medium, such as copper wire, a conventional twisted pair wireline, a conventional network cable, a conventional optical data transmission cable, or even air or a vacuum (e.g., outer space) for wireless signal transmissions. The waveform and/or code for implementing the present method(s) are generally digital, and are generally configured for processing by a conventional digital data processor (e.g., a microprocessor, microcontroller, or logic circuit such as a programmable gate array, programmable logic circuit/device or application-specific [integrated] circuit).

CONCLUSION/SUMMARY

Thus, the present invention provides circuits, architectures, systems and methods for indicating positions of defective data storage cells using "pilot" or reserved cells. The present invention improves error correction capabilities using cells that are typically already available, instead of allocating additional circuitry or resources to improve system functionality and/or performance. In some cases, marking data from defective cells as erasures effectively doubles the error correction power or capability of a decoder/receiver receiving the data. Surprisingly, when the reserved cells contain more than one level, the overhead for a given level of fault coverage decreases as a function of memory size.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

What is claimed is:

1. A circuit, comprising:
a memory comprising a plurality of subunits, each subunit comprising (i) a plurality of data storage cells and (ii) at least one reserved cell configured to store status information identifying a status of one or more of the plurality of data storage cells in said subunit, wherein each of said data storage cells is configured to store a plurality of data bits, and each of said at least one reserved cell comprises a multi-bit cell configured to store a lower density of information than each of said data storage cells; and
an error correction code circuit configured to indicate, in a data stream formed from the memory, positions of data from the data storage cells for which status information is stored.

2. The circuit of claim 1, further comprising a memory controller configured to read said at least one reserved cell, identify positions of defective data storage cells, and read data from and write data to said data storage cells.

3. The circuit of claim 2, wherein said memory controller stores information regarding a position of each of said at least one reserved cell.

4. The circuit of claim 3, wherein each of said at least one reserved cell has an arbitrary position in said subunit.

5. The circuit of claim 1, wherein said status information indicates whether one or more of the plurality of data storage cells in said subunit are defective or valid.

6. The circuit of claim 1, wherein said at least one reserved cell is physically identical to each of said data storage cells.

7. The circuit of claim 1, wherein each of said data storage cells is configured to differentiate between a first plurality of voltage levels, and said at least one reserved cell is configured to differentiate between fewer voltage levels than said data storage cells.

8. The circuit of claim 7, wherein each of said voltage levels represents a unique value.

9. The circuit of claim 7, wherein the first plurality of voltage levels is equal to $2^n$, where n is the number of bits in each data storage cell, and the number of voltage levels in each of said at least one reserved cell corresponds to a number of bits smaller than n.

10. The circuit of claim 1, wherein said at least one reserved cell is configured to store an encoded position of one or more of said data storage cells for which the status information is stored.

11. The circuit of claim 1, further comprising a decoder configured to identify, detect and/or process and correct error indicators in said data stream.

12. The circuit of claim 1, wherein each of said at least one reserved cell and said data storage cells comprises a transistor having one or more floating gates.

13. The circuit of claim 1, wherein each of said plurality of subunits comprises a plurality of reserved cells, including said at least one reserved cell.

14. The circuit of claim 1, wherein said information specifies that one or more of the data storage cells in said subunit is defective.

15. A transceiver, comprising:
the circuit of claim 1;
a transmitter configured to transmit serial data to a network;
a receiver configured to receive said serial data from said network; and
a clock generator configured to provide a reference clock signal to said transmitter and said receiver.

16. The transceiver of claim 15, embodied on a single integrated circuit.

17. A system for transferring data on or across a network, the system comprising:
the transceiver of claim 15;
a first port communicatively coupled to said transmitter; and
a second port communicatively coupled to said receiver.

18. The system of claim 17, configured to identify locations of error indicators in said data stream from said positions of said data storage cells for which the status information is stored.

19. A network, comprising:
a plurality of the systems of claim 17, communicatively coupled to each other; and
a plurality of storage devices and/or communications devices, each of said storage devices and/or communications devices being communicatively coupled to one of said systems.

20. A method for identifying memory positions, the method comprising:
determining a status of data storage cells in one of a plurality of subunits in a memory, wherein each of said data storage cells is configured to store a plurality of data bits;
storing information regarding the status of the data storage cells in at least one reserved cell corresponding to said one subunit, wherein each of said at least one reserved cell comprises a multi-bit cell configured to store a lower density of information than each of said data storage cells;
reading said at least one reserved cell; and
indicating, in a data stream formed from the memory, positions of data from data storage cells for which status information is stored.

21. The method of claim 20, wherein said information comprises a position of each of said data storage cells for which the information is stored.

22. The method of claim 20, wherein said information identifies whether one or more of the data storage cells in said one subunit are defective or valid.

23. The method of claim 22, further comprising disabling the capability to perform read and write operations to said positions identified by said at least one reserved cell as being defective.

24. The method of claim 22, further comprising marking said positions identified by said at least one reserved cell as erasures during an error recovery step.

25. The method of claim 20, wherein said information comprises encoded information including the status of a number of said data storage cells in said subunit, and when said number is at least 1, a location of said data storage cell(s).

26. The method of claim 20, wherein each of said data storage cells is configured to differentiate between a first plurality of voltage levels, and said at least one said reserved cell differentiates between fewer voltage levels than said data storage cells.

27. The method of claim 26, wherein the first plurality of voltage levels is equal to $2^n$, where n is the number of bits in each data storage cell, and the number of voltage levels in each of said at least one reserved cell corresponds to a number of bits smaller than n.

28. The method of claim 20, further comprising storing information identifying a position of each of said at least one reserved cell in a memory controller.

29. The method of claim 20, wherein said plurality of subunits comprises a plurality of reserved cells, including said at least one reserved cell.

30. The method of claim 20, wherein said information specifies that one or more of the data storage cells in said subunit is defective.

31. A computer program or waveform, stored on a non-transitory computer-readable medium, containing a computer-readable set of instructions which, when executed by a processing device configured to execute computer-readable instructions, is configured to perform the method of claim 20.

32. The computer program or waveform of claim 31, comprising at least one instruction to compile a data stream containing data from said data storage cells.

33. The computer program or waveform of claim 31, comprising at least one instruction to mark data from said data storage cells for which status information is stored as an erasure.

* * * * *